(12) United States Patent
Mo et al.

(10) Patent No.: US 10,777,337 B2
(45) Date of Patent: Sep. 15, 2020

(54) ELECTRONIC DEVICE WIRE CONDUCTOR FORMATION METHOD

(71) Applicant: AJOHO ENTERPRISE CO., LTD., Taipei (TW)

(72) Inventors: Chia-Ping Mo, Taipei (TW); You-Chi Liu, Taipei (TW)

(73) Assignee: Ajoho Enterprise Co., Ltd., Taipei (TW)

( * ) Notice: Subject to any disclaimer, the term of this patent is extended or adjusted under 35 U.S.C. 154(b) by 327 days.

(21) Appl. No.: 15/977,947

(22) Filed: May 11, 2018

(65) Prior Publication Data
US 2019/0131036 A1    May 2, 2019

(30) Foreign Application Priority Data

Nov. 2, 2017   (TW) .............................. 106137961 A (51) Int. Cl.
| | |
|---|---|
| *B29C 45/14* | (2006.01) |
| *H01B 13/00* | (2006.01) |
| *H01F 27/28* | (2006.01) |
| *H01F 41/04* | (2006.01) |
| *H05K 1/00* | (2006.01) |
| *H01B 13/08* | (2006.01) |

(52) U.S. Cl.
CPC ... *H01B 13/0026* (2013.01); *B29C 45/14065* (2013.01); *H01B 13/08* (2013.01); *H01F 27/2804* (2013.01); *H01F 41/041* (2013.01); *H01F 41/043* (2013.01); *H05K 1/00* (2013.01); *H01F 2027/2814* (2013.01)

(58) Field of Classification Search
CPC .............. H01B 13/0026; H01F 41/041; H01F 27/2804; H01F 41/043; B29C 2037/0046; B29C 65/526; B29C 2045/14745; B29C 45/14827
See application file for complete search history.

(56) References Cited

U.S. PATENT DOCUMENTS

| | | | |
|---|---|---|---|
| 2014/0113115 A1* | 4/2014 | Ito ....................... | B32B 38/0036 428/201 |
| 2017/0235221 A1* | 8/2017 | Nagai ................... | B29C 59/026 264/40.1 |
| 2020/0118740 A1* | 4/2020 | Banba ..................... | H01F 17/00 |

* cited by examiner

*Primary Examiner* — Xiao S Zhao
*Assistant Examiner* — Victoria Bartlett
(74) *Attorney, Agent, or Firm* — Muncy, Geissler, Olds & Lowe, P.C.

(57) ABSTRACT

An electronic device wire conductor formation method includes the steps of using a plastic injection molding machine to create an insulative plastic block, operating a top mold of a transfer-printing equipment to reciprocate an adhesive-applying portion along a transfer-printing portion of a bottom mold for causing the adhesive-applying portion to coat a molten conductive adhesive evenly on the transfer-printing portion, inverting the insulative plastic block to attach molding units thereof onto the transfer-printing portion of the bottom mold for enabling the molten conductive adhesive to be transfer-printed onto U-shaped plates of the molding units, and finally removing the insulative plastic block from the bottom mold and then curing the coated conductive adhesive to form individual conductors on the respective U-shaped plate of molding units.

8 Claims, 12 Drawing Sheets

ELECTRONIC DEVICE WIRE CONDUCTOR FORMATION METHOD

This application claims the priority benefit of Taiwan patent application number 106137961, filed on Nov. 2, 2017.

BACKGROUND OF THE INVENTION

1. Field of the Invention

The present invention relates to magnetic technologies and more particularly, to an electronic device wire conductor formation method for making wire conductors for electronic device by using a transfer-printing equipment consisting of a bottom mold and a top mold to transfer-print a molten conductive adhesive to U-shaped plates of an insulative plastic block and then curing the printed conductive adhesive to form individual wire conductors after removal of the insulative plastic block from the transfer-printing equipment.

2. Description of the Related Art

With the rapid growth of electronic technology, active components and passive components are widely used on internal circuit boards of electronic products. Active components (such as microprocessors or IC chips) can perform arithmetic and processing functions alone. However, passive components (such as resistors, capacitors and inductors, etc.) will maintain their resistance or impedance when the applied current or voltage is changed. In application, active components and passive components are used in information, communication and consumer electronic products to achieve electronic loop control subject to matching of circuit characteristics between components.

Further, an inductor will generate an electromotive force due to a change in current in the circuit, thereby resisting the change in current. There are many types of inductors. Inductors often used as electromagnets and transformers are known as coil that can provide high resistance to high frequency. An inductor for use to block higher-frequency alternating current (AC) in an electrical circuit, while passing lower-frequency or direct current (DC) is often referred to as choke or choke ring. Large inductors used with ferromagnetic materials in transformers, motors and generators are called windings. Inductors according to the electromagnetic induction can be divided into self-induction and mutual induction. When the wire turns wound round the magnetic body (such as magnetic core or ferromagnetic material) increases, the inductance will also become larger. The number of wire turns, the area of the wire turns (loop) and the wire material will affect the inductance size.

An inductor typically consists of an insulated wire wound into a coil around a ferromagnetic magnetic core or a core material with a higher magnetic permeability than the air. When the current flowing through an inductor changes, the time-varying magnetic field induces a voltage in the conductor. However, in actual applications, conventional inductors still have drawbacks as follows:

(1) When the insulated wire is wound into a coil around the ferromagnetic magnetic core, uneven winding of the coil often occurs due to differences in manual winding distribution, and the stray capacitance on the inductor will be difficult to control, resulting in differences between the noise suppression capabilities of same specification coils. Thus, the exact distance between the coil windings must be controlled. Due to small core volume, the manual winding method takes a lot of man-hours. Further, manual winding is not practical for mass production so that the manufacturing cost cannot be reduced.

(2) In order to obtain a larger amount of inductance, the coil windings will generally be overlapped, however, the insulative layer of the enameled wire can easily be scratched during the winding process. Further, overlapping the coil windings of the insulated wire around the ferromagnetic magnetic core will greatly increase the dimension of the inductor, in sequence, the inductor will require a relatively larger circuit board mounting surface to affect the overall circuit layout. When bonding the leads of the coil of the inductor to a circuit board, the large volume of the coil can touch other electronic components on the circuit board, causing coil damage and affecting the electrical characteristics and charge and discharge functions of the inductor.

SUMMARY OF THE INVENTION

The present invention has been accomplished under the circumstances in view. It is therefore the main object of the present invention to provide an electronic device wire conductor formation method for making wire conductors for electronic device, which improves the manufacturing quality and yield, achieving the effects of simple structure, ease of installation, high production efficiency and cost effectiveness.

To achieve this and other objects of the present invention, an electronic device wire conductor formation method comprises a first step of using a plastic injection molding machine to create an insulative plastic block comprising a block base and a plurality of molding units each consisting of a plurality of U-shaped plates respectively arranged in an array in the block base, a second step of operating a top mold of a transfer-printing equipment to reciprocate an adhesive-applying portion along a transfer-printing portion of a bottom mold of the transfer-printing equipment for causing the adhesive-applying portion to coat a molten conductive adhesive evenly on the transfer-printing portion, a third step of inverting the insulative plastic block to downwardly attach the molding units onto the transfer-printing portion of the bottom mold for enabling the molten conductive adhesive to be transfer-printed onto the U-shaped plates of the molding units, and finally a fourth step of removing the insulative plastic block from the bottom mold and then curing the coated conductive adhesive to form individual conductors on the respective U-shaped plate of molding units.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Referring to FIGS. 1-6, an electronic device wire conductor formation method of the present invention uses a transfer-printing equipment 2 to transfer-print a conductive adhesive 3 onto an insulative plastic block 1 for creating conductors 3' through a curing process. The insulative plastic block 1 is an one piece plastic member made by injection molding, comprising a block base 11 defining therein a recessed open chamber 10, a plurality of partition plates 111 disposed in the recessed open chamber 10 and arranged in two arrays and dividing the recessed open chamber 10 into a plurality of parallel channels 112, two opposing molding units 12 each comprising a plurality of U-shaped plates 121 mounted in each channel 112 in one respective array of partition plates 111 with two opposite ends thereof protruding over the block base 11 and an isolation groove 122 of a predetermined width defined between each two adjacent U-shaped plates 121 in each channel 112.

Figure 3:
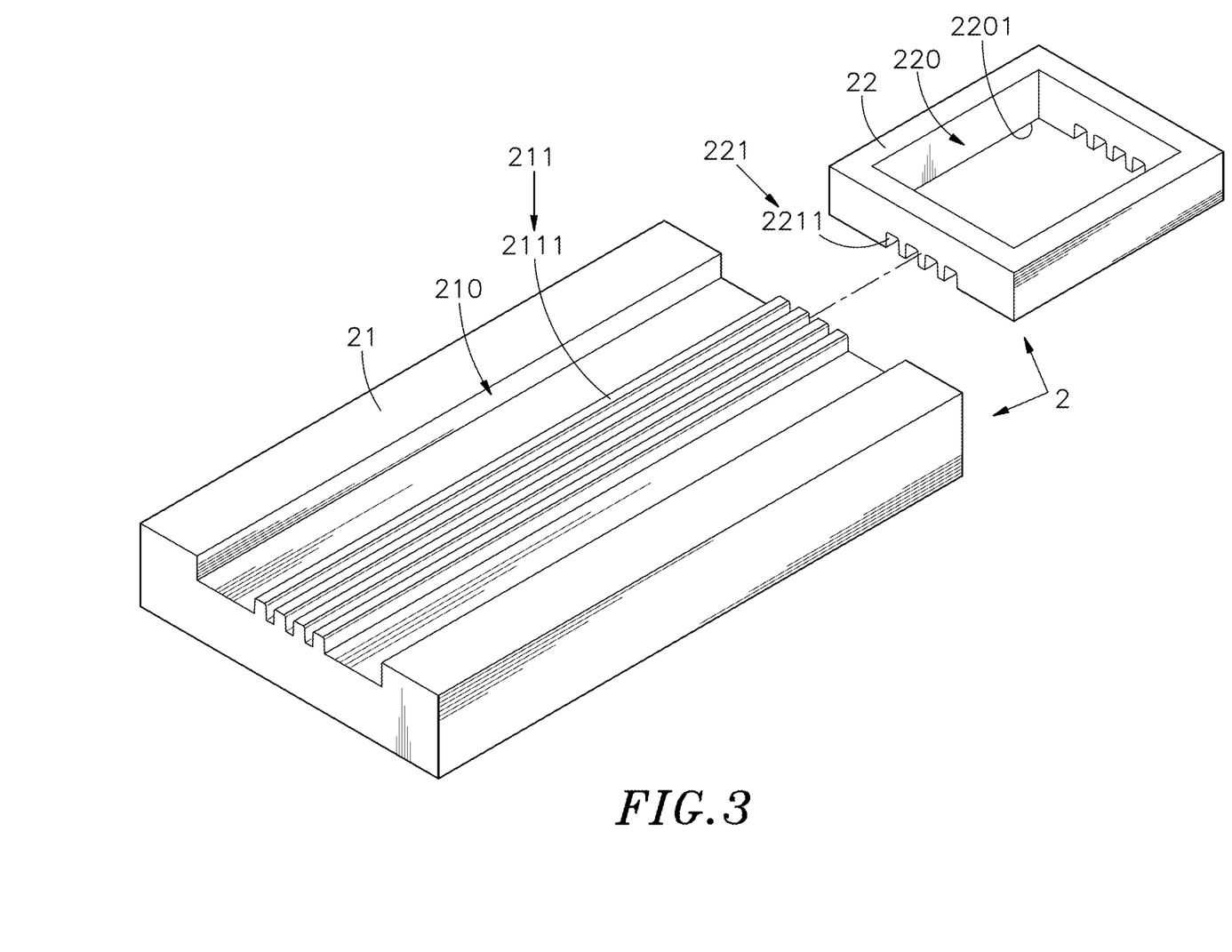
FIG. 3 is an exploded view of the transfer-printing equipment.
Figure 4:
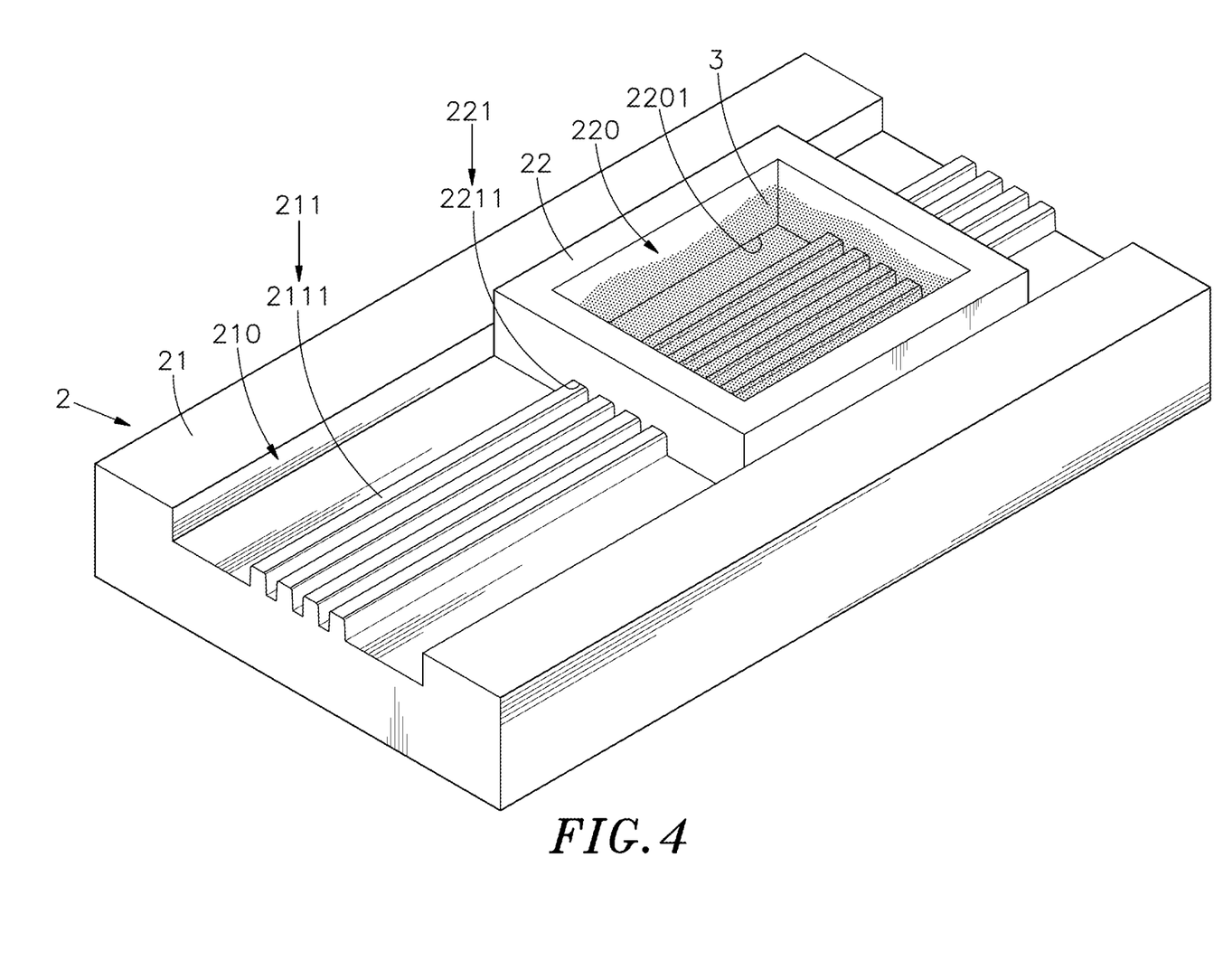
FIG. 4 is a schematic elevational view, illustrating a molten conductive adhesive filled in the top mold of the transfer-printing equipment.
Figure 5:
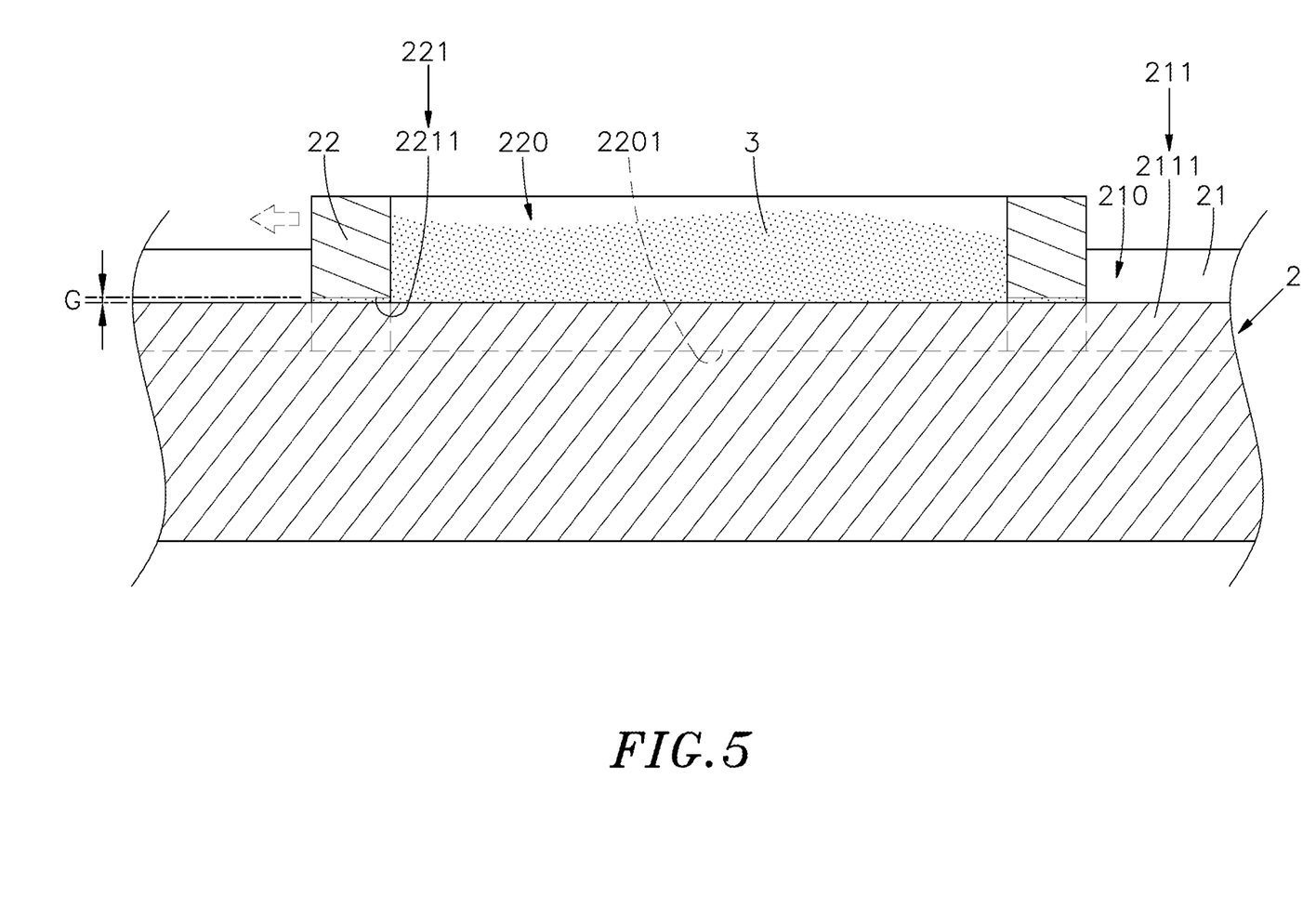
FIG. 5 is a sectional side view, illustrating the molten conductive adhesive coated on the bottom mold of the transfer-printing equipment.

The transfer-printing equipment 2 comprises a bottom mold 21, and a top mold 22 mounted in a top side of the bottom mold 21. The bottom mold 21 comprises a position-limiting sliding groove 210 located on a top side thereof, a transfer-printing portion 211 consisting of parallel rails 2111 and located on a middle part of the position-limiting sliding groove 210 and extending along the length thereof. The top mold 22 is mounted in the position-limiting sliding groove 210 of the bottom mold 21, comprising an internal storage chamber 220 for holding the molten conductive adhesive 3 that can be, but not limited to, conductive silver paste, conductive silver adhesive or conductive paint, a dispensing hole 2201 disposed in a bottom side of the internal storage chamber 220, and two adhesive-applying portions 221 disposed at two opposite lateral sides of the dispensing hole 2201. Each adhesive-applying portion 221 defines therein a plurality of rail grooves 2211 respectively and slidably coupled to the rails 2111. Further, there is a gap G defined between each rail groove 2211 and the respective rail 2111.

Figure 1:
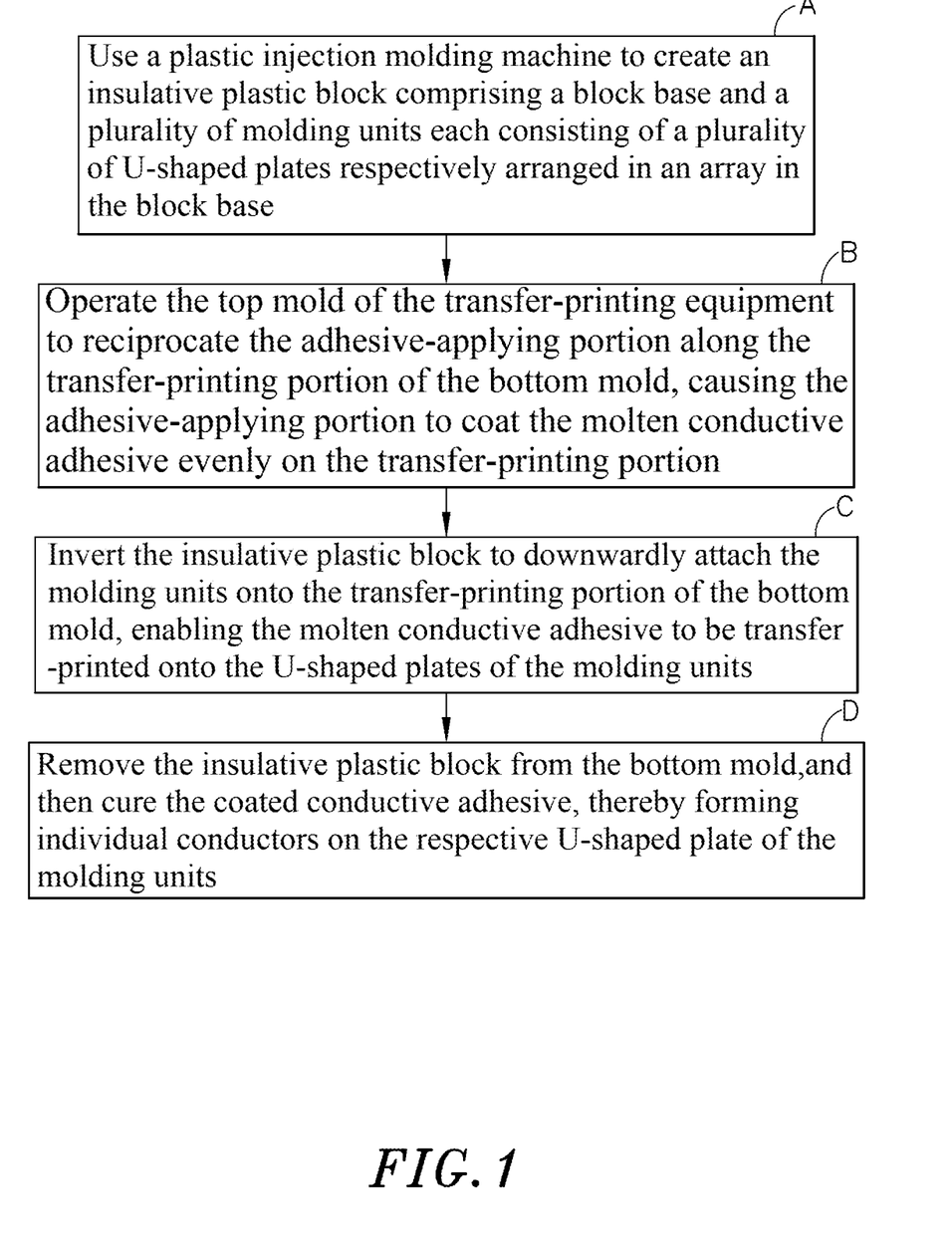
FIG. 1 is a flow chart of an electronic device wire conductor formation method of the present invention.
Figure 2:
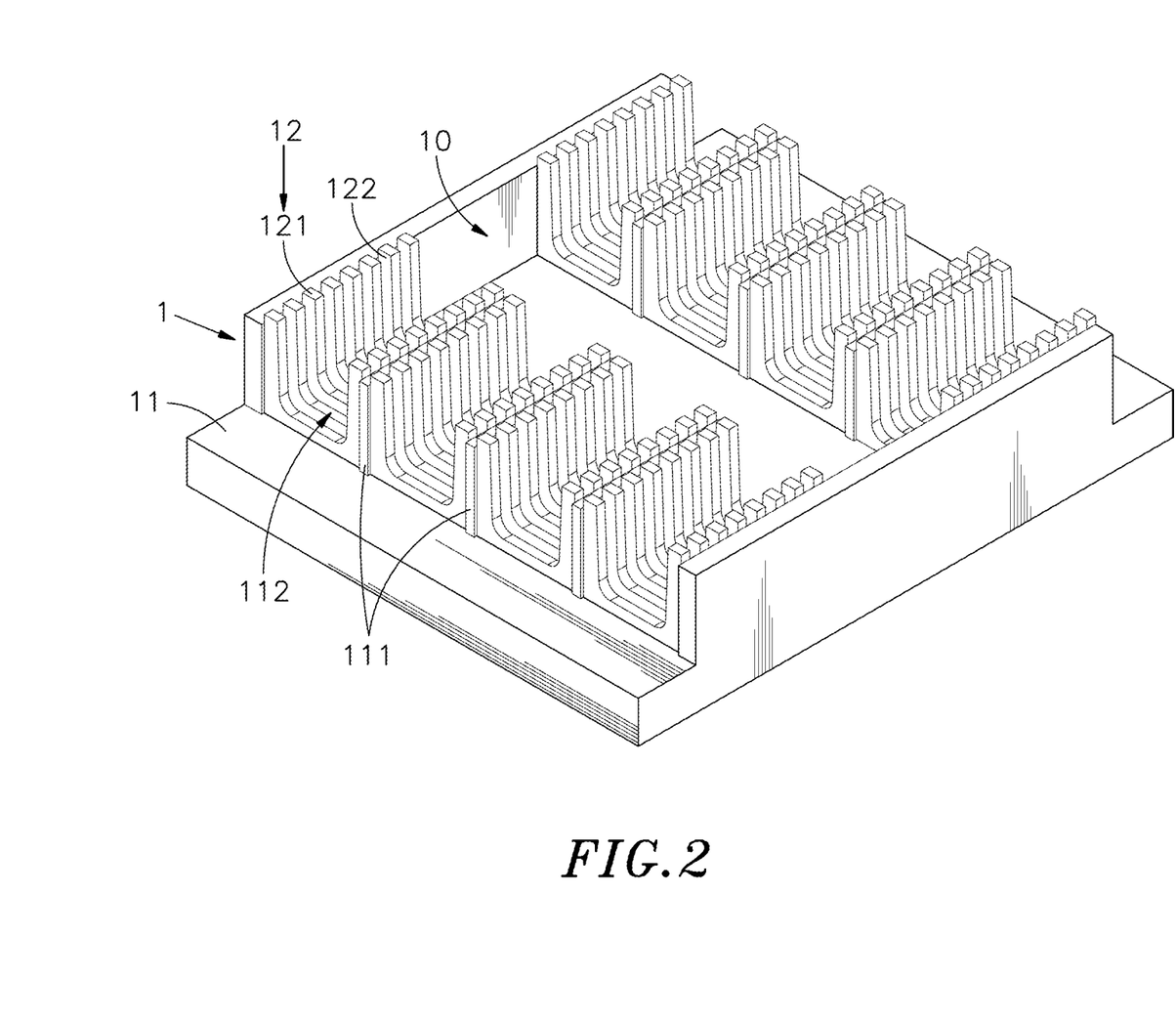
FIG. 2 is an oblique elevational view of the insulative plastic block.

When using the transfer-printing equipment 2 to transfer-print the conductive adhesive 3 onto an insulative plastic block 1 for creating the desired conductors 3', the electronic device wire conductor formation method comprises the steps of:

(A) Use a plastic injection molding machine to create an insulative plastic block 1 comprising a block base 11 and a plurality of molding units 12 each consisting of a plurality of U-shaped plates 121 respectively arranged in an array in the block base 11.

(B) Operate the top mold 22 of the transfer-printing equipment 2 to reciprocate the adhesive-applying portion 221 along the transfer-printing portion 211 of the bottom mold 21, causing the adhesive-applying portion 221 to coat the molten conductive adhesive 3 evenly on the transfer-printing portion 211.

(C) Invert the insulative plastic block 1 to downwardly attach the molding units 12 onto the transfer-printing portion 211 of the bottom mold 21, enabling the molten conductive adhesive 3 to be transfer-printed onto the U-shaped plates 121 of the molding units 12.

(D) Remove the insulative plastic block 1 from the bottom mold 21, and then cure the coated conductive adhesive 3, forming individual conductors 3' on the respective U-shaped plate 121 of the molding units 12.

Figure 6:
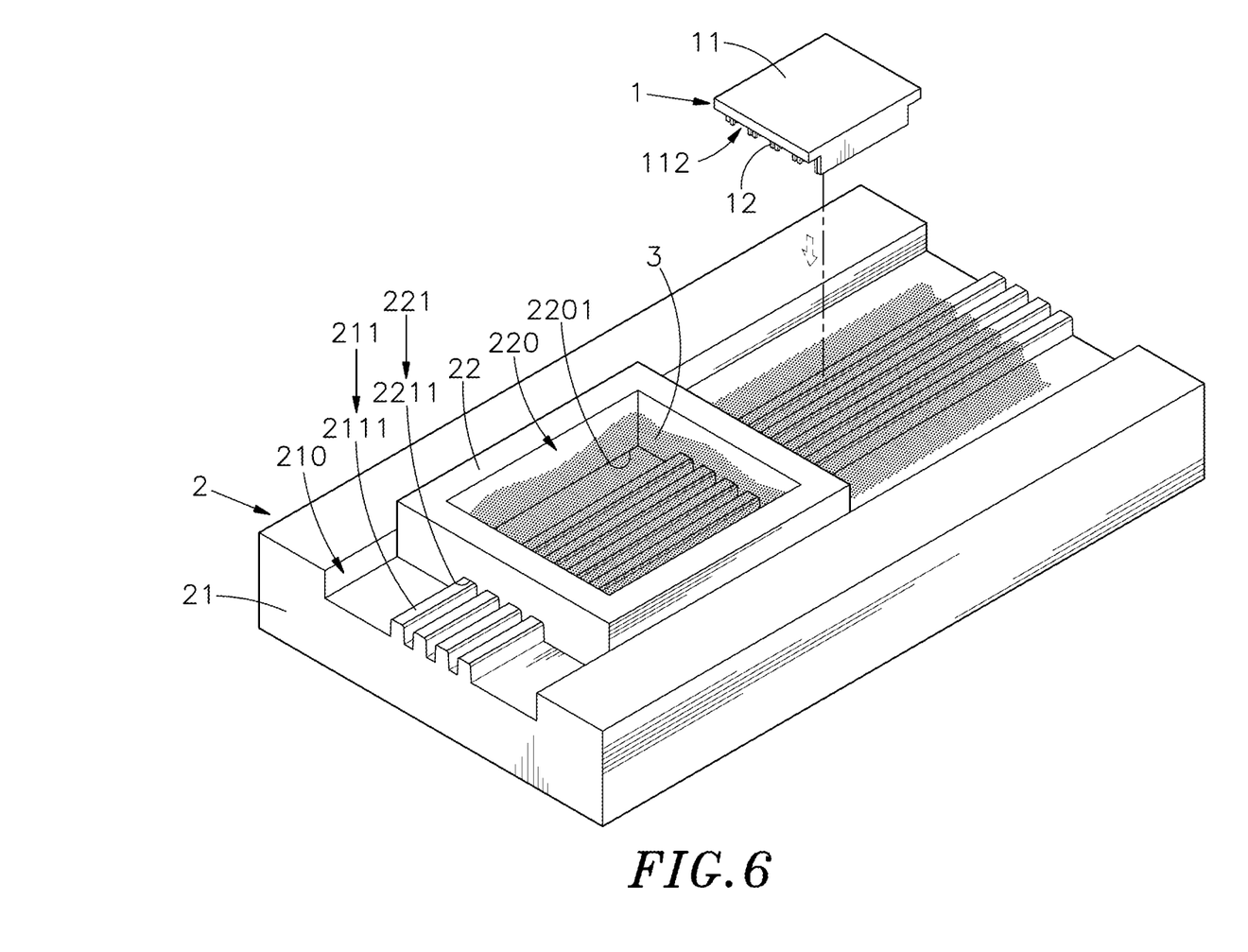
FIG. 6 is a schematic elevational view, illustrating the molten conductive adhesive coated on the bottom mold of the transfer-printing equipment before insertion of the insulative plastic block into the transfer-printing equipment.
Figure 7:
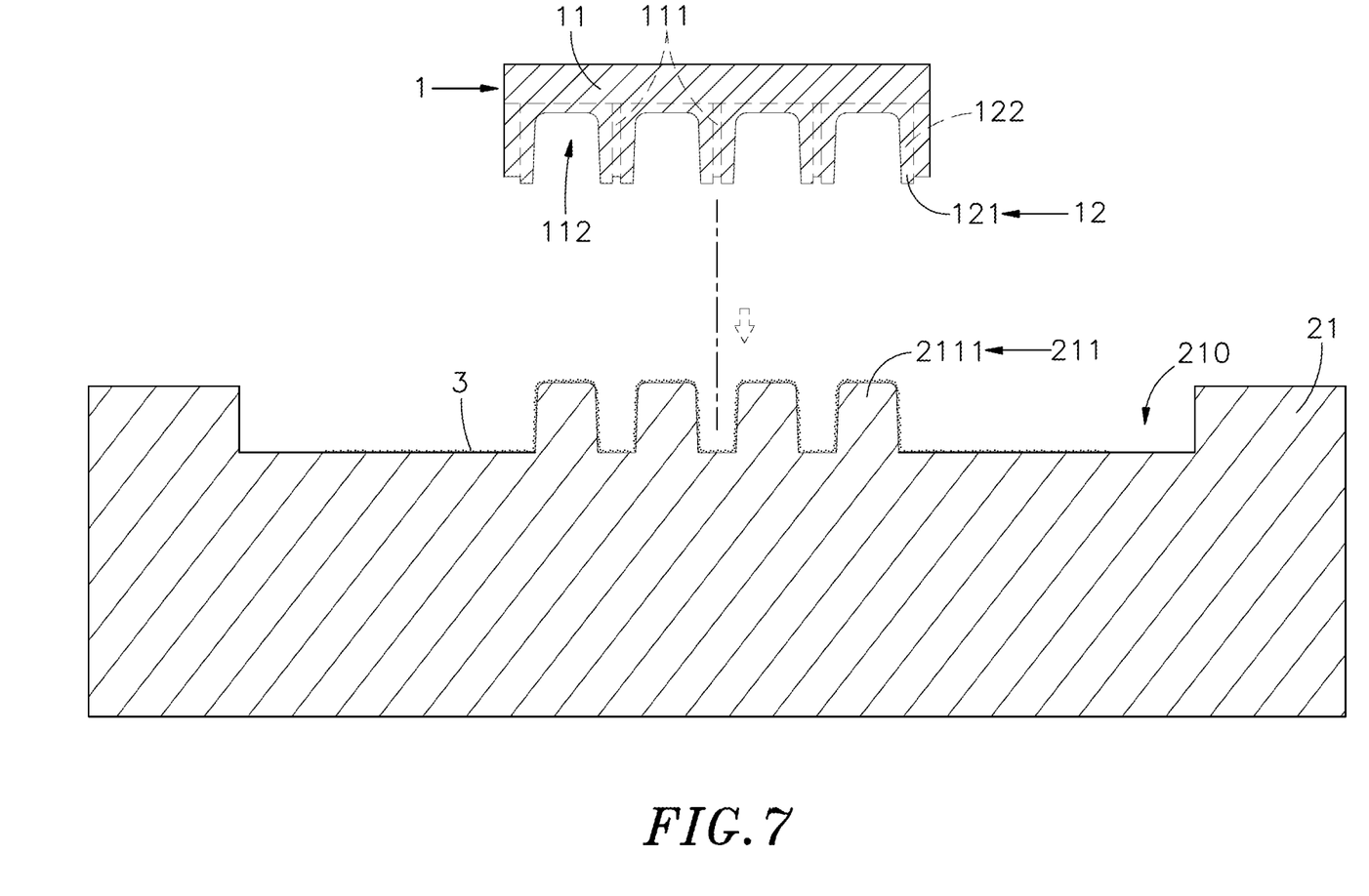
FIG. 7 is a schematic front view, illustrating the relationship between the insulative plastic block and the transfer-printing equipment before transfer printing.
Figure 8:
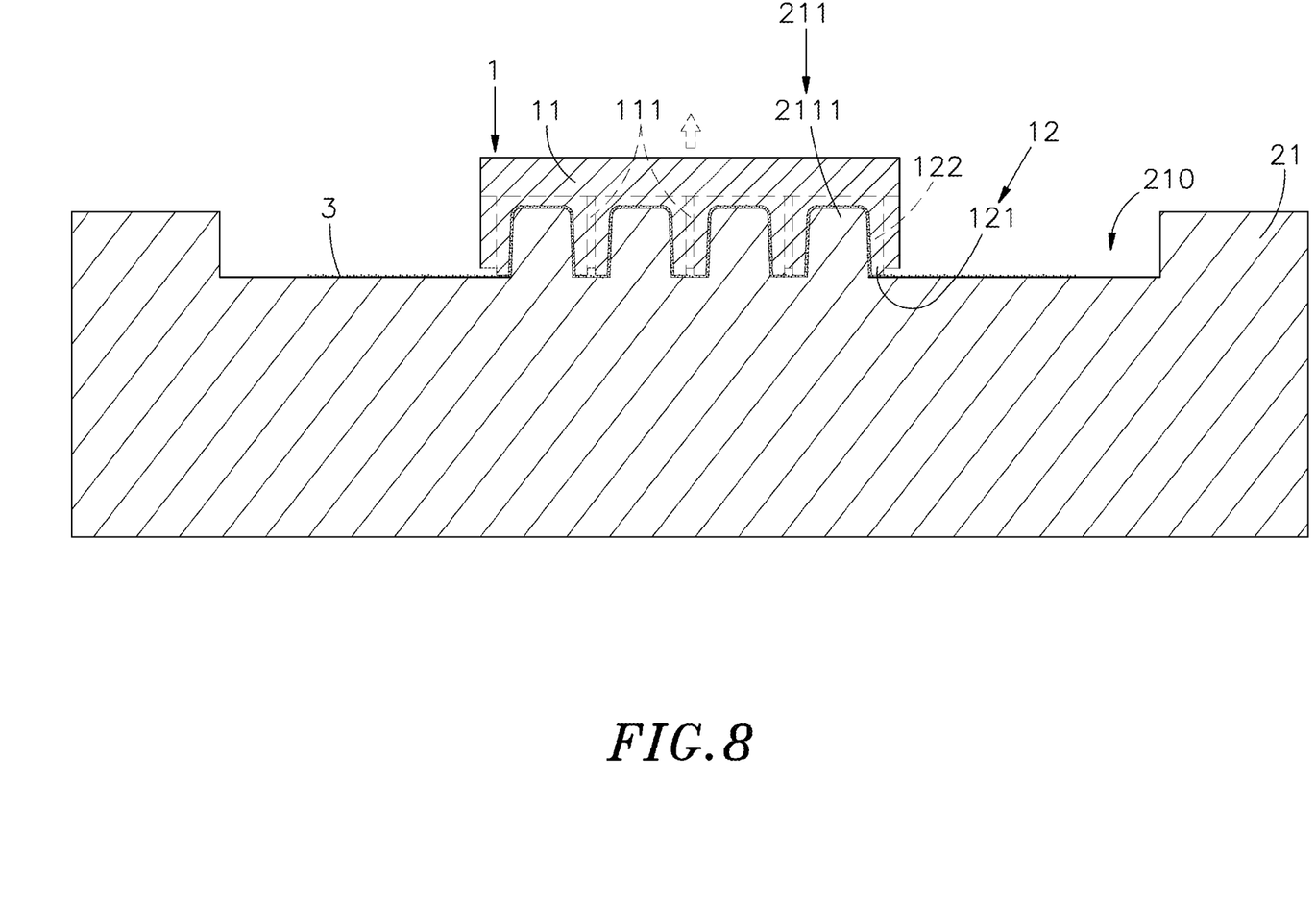
FIG. 8 corresponds to FIG. 7, illustrating the insulative plastic block inserted into the transfer-printing equipment for transfer printing.
Figure 9:
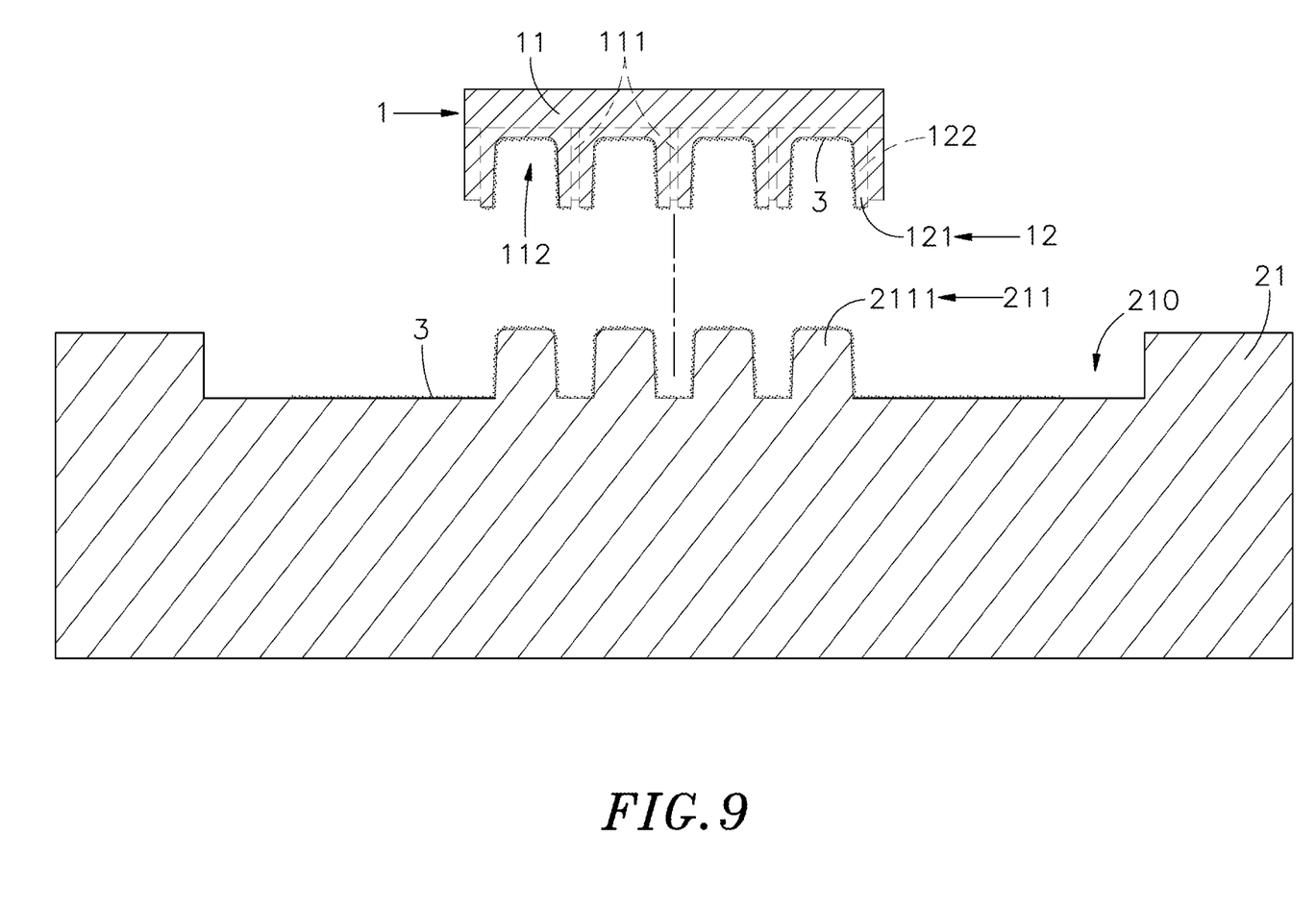
FIG. 9 corresponds to FIG. 8, illustrating the insulative plastic block removed from the transfer-printing equipment after transfer printing.
Figure 10:
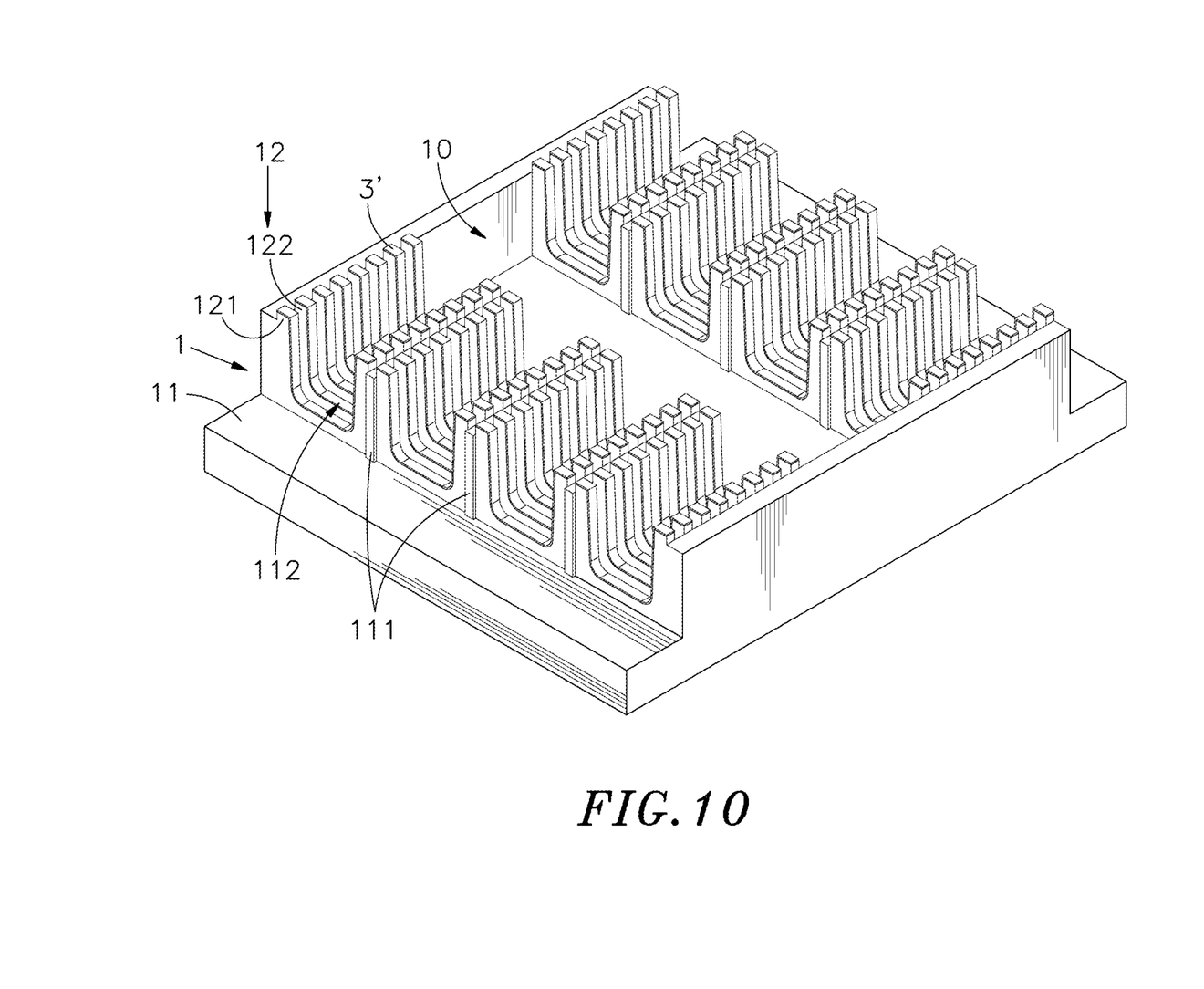
FIG. 10 is an elevational view of the insulative plastic block, illustrating individual wire conductors respectively formed on the U-shaped plates.

When the top mold 22 of the transfer-printing equipment 2 is moved along the position-limiting sliding groove 210 of the bottom mold 21 from the rear side toward the front side, the molten conductive adhesive 3 is dispensed from the internal storage chamber 220 of the top mold 22 through the dispensing hole 2201 onto the transfer-printing portion 211 of the bottom mold 21. At this time, the rail grooves 2211 of the adhesive-applying portion 221 remove excessive molten conductive adhesive 3 from the rails 2111 of the transfer-printing portion 211. Since there is a gap G defined between each rail groove 2211 and the respective rail 2111, a layer of the molten conductive adhesive 3 of thickness equal to the gap G is left on each rail 2111 and coated by the adhesive-applying portion 221 onto the transfer-printing portion 211.

Referring to FIGS. 7-10, when the adhesive-applying portion 221 of the top mold 22 is reciprocated in the bottom mold 21, the molten conductive adhesive 3 is evenly coated on the transfer-printing portion 211. Thereafter, invert the insulative plastic block 1 to downwardly attach the U-shaped plates 121 of the molding units 12 onto the respective rails 2111 of the transfer-printing portion 211, causing the U-shaped plates 121 to pick up the molten conductive adhesive 3 from the rails 2111, and thus, the molten conductive adhesive 3 is transfer-printed onto the U-shaped plates 121. Subject to the design of the insolation grooves 122, the molten conductive adhesive 3 on one U-shaped plate 121 is isolated from that on another U-shaped plate 121. Thereafter, remove the insulative plastic block 1 from the bottom mold 21 and then curing the transfer-printed conductive adhesive 3 by baking or ultraviolet light. After the curing process, individual wire conductors 3' are respectively formed on the U-shaped plates 121 of the molding units 12. Each conductor 3' has two opposite ends thereof respectively terminating in a respective lead 31'. The invention uses the transfer-printing equipment 2 to transfer-print the applied conductive adhesive 3 onto the insulative plastic block 1 for creating individual wire conductor 3' through a curing process. This method facilitates control of the formation direction and density of the wire conductors 3' subject to actual needs, eliminating difference in gap between each two adjacent wire conductors 3' to affect the electrical characteristics of the product, improving manufacturing quality and yield and achieving the effects of simple structure, ease of installation, high production efficiency and cost effectiveness.

Figure 11:
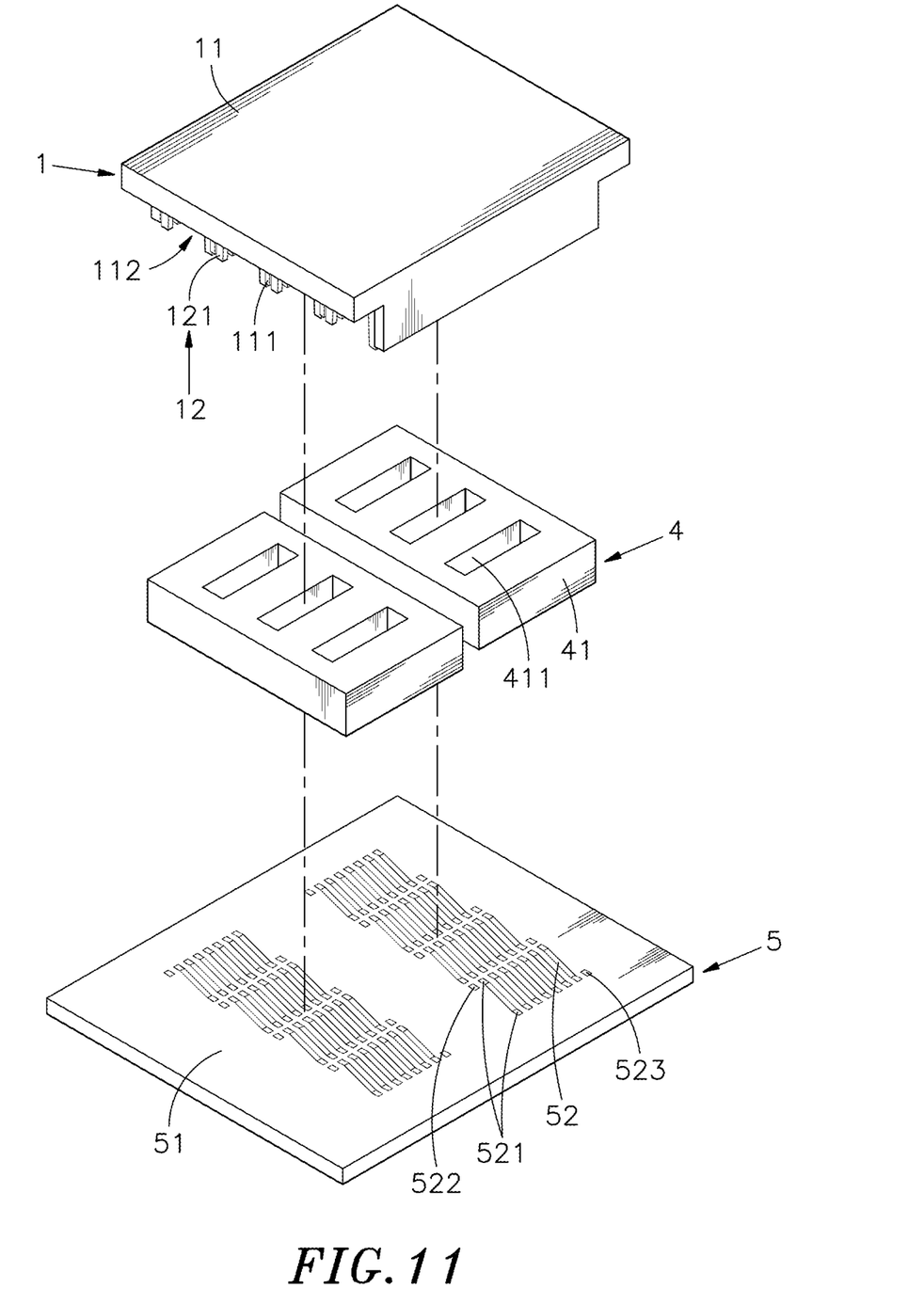
FIG. 11 is an exploded view of an inductor made in accordance with the present invention.
Figure 12:
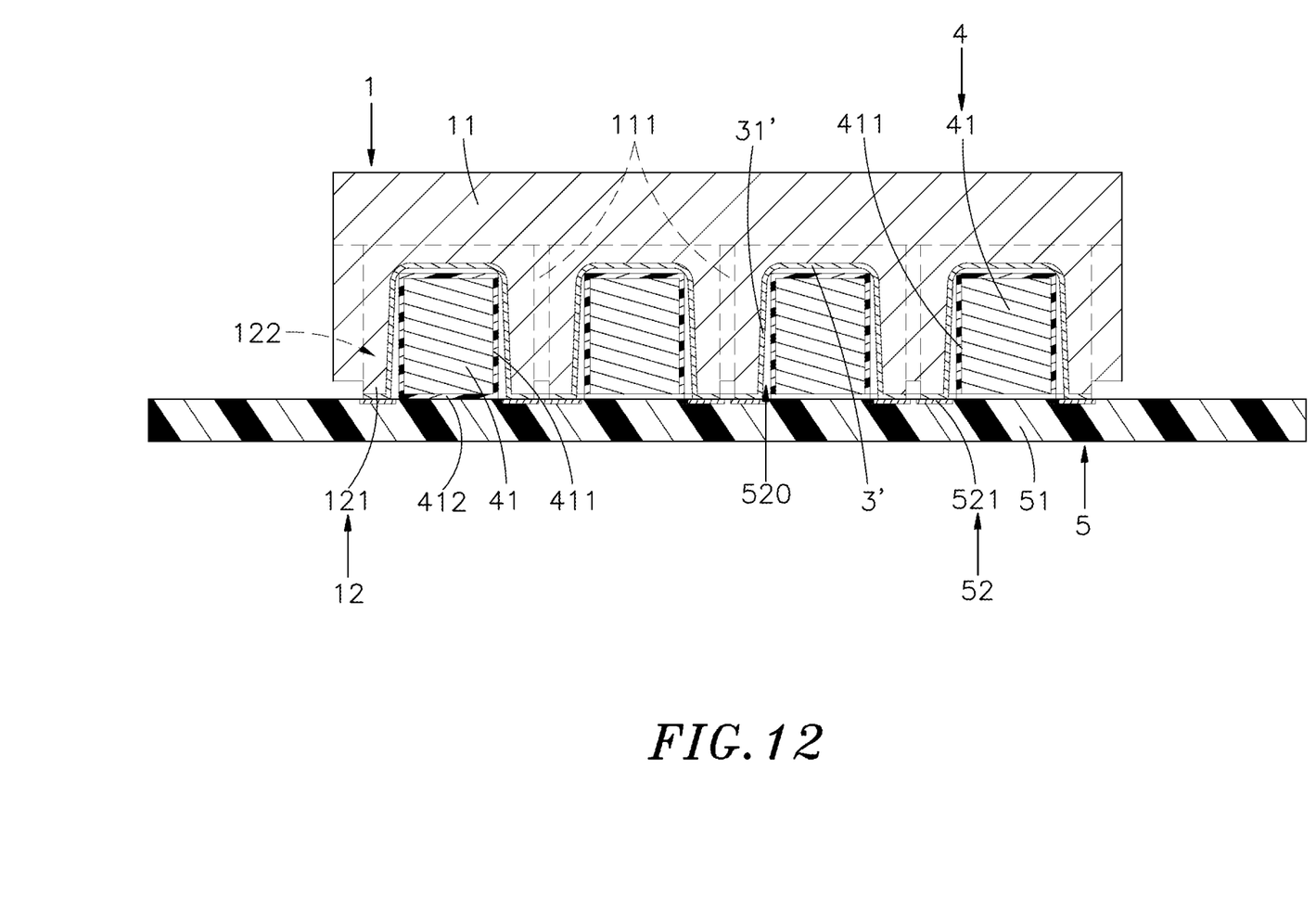
FIG. 12 is a sectional front view of the inductor shown in FIG. 11.

Referring to FIGS. 11 and 12, magnetic conductive components 4 are mounted in recessed open chamber 10 of the insulative plastic block 1. Each magnetic conductive component 4 comprises a magnetic core 41 in, for example, rectangular shape. The magnetic core 41 comprises a plurality of slots 411 cut through opposing top and bottom sides thereof, and an insulative layer 412 formed of an insulative paint and covered over the surface thereof. When assembling the insulative plastic block 1 and the magnetic conductive components 4, set the magnetic cores 41 of the magnetic conductive components 4 in the channels 112 of the block base 11 to let the U-shaped plates 121 of the molding units 12 be inserted into the slots 411 of the magnetic cores 41, enabling the leads 31' of the conductors 3' to be disposed outside the respective slots 411. Thus, the wire conductors 3' are disposed outside the magnetic cores 41 in a parallel manner, or in an array.

Thereafter, set the insulative plastic block 1 and the magnetic conductive component 4 on a substrate 51 of a connection carrier 5. The substrate 51 is selected from, but not limited to, the group of bakelite, fiberglass, plastic sheet, ceramic and prepregs. Further, a wire array 52 made of a copper foil is located on the substrate 51. The wire array 52 comprises a plurality of contact sets 521 each comprising two staggered rows of contacts, an input side 522 electrically connected with a first contact of each contact set 521, and an output side 523 electrically connected with a last contact of each contact set 521. In installation, set the insulative plastic block 1 and the magnetic conductive component 2 on the substrate 51 of the connection carrier 5 to abut the leads 31' of the wire conductors 3' at the contact sets 521 of the wire array 52 and the applied solder material (such as solder paste, solder balls or conductive adhesive), and then employ surface-mount technology (SMT) to bond the leads 31' of the wire conductors 3' to the contact sets 521 of the wire array 52, thereby forming the desired inductor (transformer or other inductance component). When an electric current is conducted to the input side 522 of the wire array 52, the electric current goes through an induction area 520 between the contact sets 521 and the wire conductors 3' to an external circuit via the output side 523. Subject to the magnetic induction effect of the magnetic coil loop formed by the magnetic cores 41 of the magnetic conductive components 4, the inductor of the present invention provides stable inductive effect and rectifying characteristic.

As described above, the insulative plastic block 1 is made of plastics in one piece by injection molding, having multiple molding units 12 arranged in the block base 11 thereof; the adhesive-applying portion 221 of the top mold 22 of the transfer-printing equipment 2 is reciprocated on the transfer-printing portion 211 of the bottom mold 21, causing the adhesive-applying portion 221 to coat the applied molten conductive adhesive 3 on the surface of the transfer-printing portion 211; after coating of the applied molten conductive adhesive 3 on the surface of the transfer-printing portion 211, the insulative plastic block 1 is inverted, enabling the molding units 12 to be attached onto the transfer-printing portion 211 of the bottom mold 21 so that the molten conductive adhesive 3 can be transfer-printed onto the U-shaped plates 121 of the molding units 12; after transfer printing, the insulative plastic block 1 is removed from the bottom mold 21, and then the transfer-printed conductive adhesive 3 is cured, thereby forming individual wire conductors 3' on the respective U-shaped plates 121. By means of transfer printing and curing process to create individual wire conductor 3', the invention facilitates control of the formation direction and density of the wire conductors 3' subject to actual needs, eliminating difference in gap between each two adjacent wire conductors 3' to affect the electrical characteristics of the product, improving manufacturing quality and yield and achieving the effects of simple structure, ease of installation, high production efficiency and cost effectiveness.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An electronic device wire conductor formation method, comprising the steps of:
   (A) using a plastic injection molding machine to create an insulative plastic block in one piece comprising a block base and a plurality of molding units, each of said molding units consisting of a plurality of U-shaped plates respectively arranged in an array in said block base;
   (B) operating a top mold of a transfer-printing equipment to reciprocate an adhesive-applying portion along a transfer-printing portion of a bottom mold of a transfer-printing equipment for causing said adhesive-applying portion to coat a molten conductive adhesive evenly on said transfer-printing portion;
   (C) inverting said insulative plastic block to downwardly attach said molding units onto said transfer-printing portion of said bottom mold for enabling said molten conductive adhesive to be transfer-printed onto said U-shaped plates of said molding units; and
   (D) removing said insulative plastic block from said bottom mold, and then curing said conductive adhesive to form individual conductors on the respective said U-shaped plate of said molding units.

2. The electronic device wire conductor formation method as claimed in claim 1, wherein said insulative plastic block further comprises a recessed open chamber defined in said block base, and a plurality of partition plates disposed in said recessed open chamber and arranged in arrays and dividing said recessed open chamber into a plurality of parallel channels; said U-shaped plates each have two opposite ends thereof protruding over said block base.

3. The electronic device wire conductor formation method as claimed in claim 2, wherein said insulative plastic block further comprises a plurality of isolation grooves respectively defined between each two adjacent said U-shaped plates.

4. The electronic device wire conductor formation method as claimed in claim 1, wherein said transfer-printing equipment comprises a bottom mold and a top mold mounted on said bottom mold, said bottom mold comprising a position-limiting sliding groove located on a top side thereof and a transfer-printing portion consisting of parallel rails and located on a middle part of said position-limiting sliding groove and extending along the length thereof, said top mold being mounted in said position-limiting sliding groove of said bottom mold and comprising an internal storage chamber for holding a molten conductive adhesive and at least one adhesive-applying portion, each said adhesive-applying portion defining therein a plurality of rail grooves respectively and slidably coupled to said rails, each said rail groove defining with the respective said rail a gap therebetween.

5. The electronic device wire conductor formation method as claimed in claim 1, wherein said top mold comprising an internal storage chamber for holding a molten conductive adhesive, a dispensing hole disposed in a bottom side of said internal storage chamber and two adhesive-applying portions disposed at two opposite lateral sides of the dispensing hole and coupled to said transfer-printing portion of said bottom mold with a gap defined therebetween.

6. The electronic device wire conductor formation method as claimed in claim 1, wherein said conductive adhesive is selected from the group of conductive silver pastes, conductive silver adhesives and conductive paints.

7. The electronic device wire conductor formation method as claimed in claim 1, wherein in step (C), said insulative plastic block is inverted to attach said molding units onto a matching transfer-printing portion of said bottom mold to pick up said molten conductive adhesive from said matching transfer-printing portion, enabling said molten conductive adhesive to be transfer-printed onto said U-shaped plates.

8. The electronic device wire conductor formation method as claimed in claim 1, wherein in step (D), removing said insulative plastic block from said bottom mold and then curing said conductive adhesive to form individual conductors on the respective said U-shaped plate of said molding units by backing or ultraviolet curing process.

* * * * *